Figure 1:
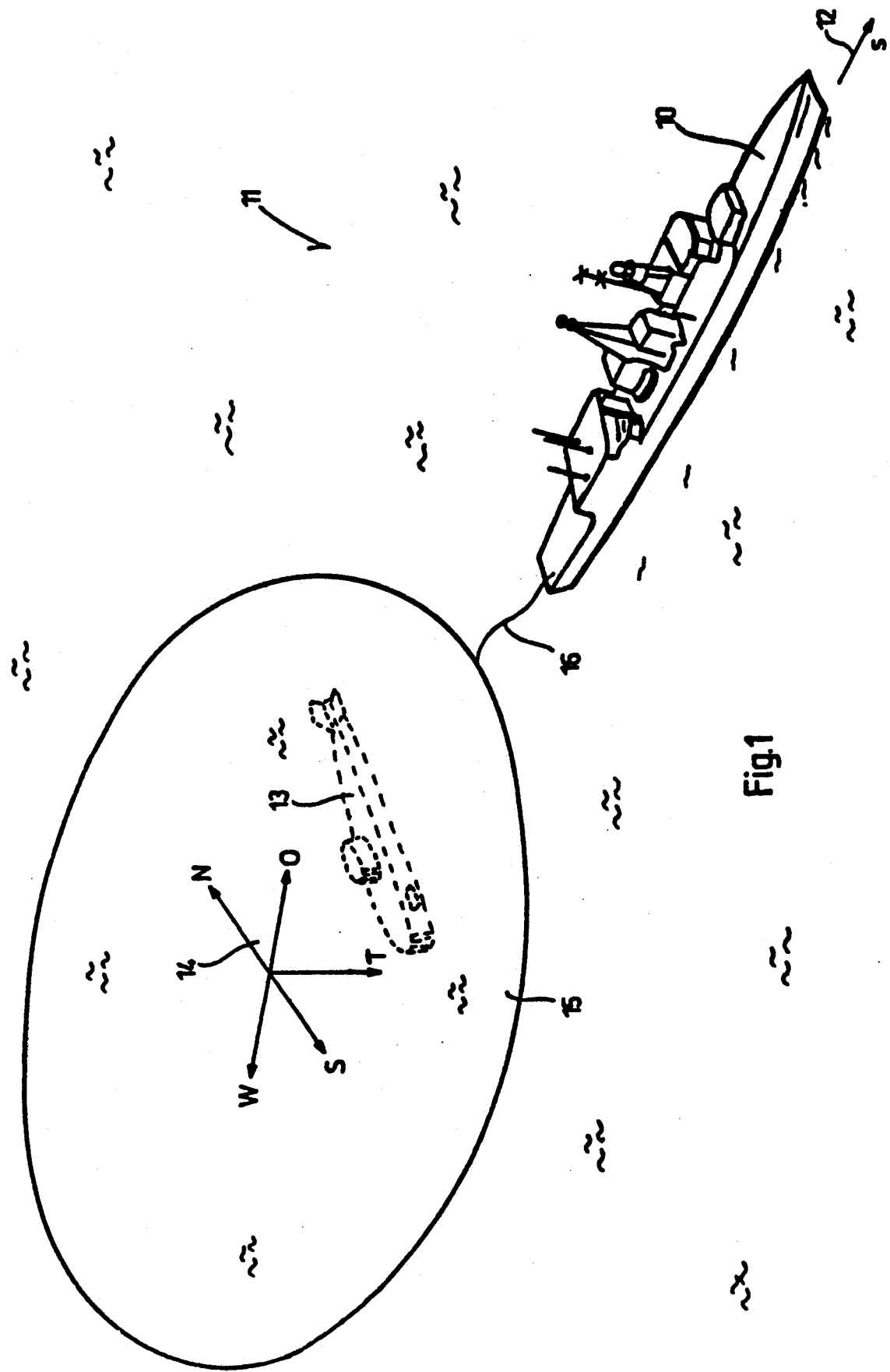

United States Patent [19]

Laukien

[11] Patent Number: 5,258,709
[45] Date of Patent: Nov. 2, 1993

[54] METHOD AND APPARATUS FOR LOCALIZING SUBMARINES

[76] Inventor: Günther Laukien, Silberstreifen, Rheinstetten-Forchheim, Fed. Rep. of Germany

[21] Appl. No.: 615,423
[22] PCT Filed: Mar. 16, 1990
[86] PCT No.: PCT/DE90/00193
§ 371 Date: Nov. 15, 1990
§ 102(e) Date: Nov. 15, 1990
[87] PCT Pub. No.: WO90/10880
PCT Pub. Date: Sep. 20, 1990

[30] Foreign Application Priority Data

Mar. 16, 1989 [DE] Fed. Rep. of Germany ....... 3908576

[51] Int. Cl.$^5$ .............................................. G01R 33/20
[52] U.S. Cl. ...................................... 324/300; 324/302
[58] Field of Search ............... 324/300, 301, 302, 303, 324/304, 307, 318, 322

[56] References Cited

U.S. PATENT DOCUMENTS

| | | | |
|---|---|---|---|
| 3,526,002 | 8/1979 | Waddel | 340/4 |
| 4,766,385 | 8/1988 | Polvani | 324/345 |
| 4,987,368 | 1/1991 | Vinegar | 324/303 |
| 5,006,802 | 4/1991 | Doisy | 324/304 |

FOREIGN PATENT DOCUMENTS

| | | |
|---|---|---|
| 0063517 | 4/1982 | European Pat. Off. . |
| 0120520 | 2/1984 | European Pat. Off. . |
| 0213418 | 8/1986 | European Pat. Off. . |
| 0237323 | 3/1987 | European Pat. Off. . |
| 2146629 | 9/1971 | Fed. Rep. of Germany . |
| 2318304 | 4/1973 | Fed. Rep. of Germany . |
| 3406343 | 2/1984 | Fed. Rep. of Germany . |
| 2621702 | 10/1987 | France . |
| 2198540 | 5/1986 | United Kingdom . |

OTHER PUBLICATIONS

Literature: IEEE Transactions on Geoscience Electronics, vol. GE-8, No. 4, Oct. 1970, Author C. L. Buchanan, "Optical and Magnetic Instruments for Mapping the Ocean Floor", pp. 320–325.

Literature: Elektrotechnische Zeitschrift/Ausgabe B, vol. 17B, No. 7, 1965 (Berlin, DE), Author: G. K. M. Pfestorf et al., "Ein Verfahren zum Orten von Eisenkörpern in grosser Tiefe", pp. 149–152.

Literature: Applied Optics, vol. 24, No. 23, Dec. 1, 1985, Optical Society of America, (New York, US) Author: W. P. Rothwell, et al., "Petrophysical applications of NMR imaging", pp. 3969–3972.

*Primary Examiner*—Michael J. Tokar
*Attorney, Agent, or Firm*—Claude A. S. Hamrick

[57] ABSTRACT

A method and an apparatus are disclosed serving to localize proton-poor objects situated in aqueous surroundings, in particular to localize submarines or sea mines in an ocean or an inland water. By using a nuclear magnetic proton resonance technique, a magnetic disturbance caused by the proton-poor object in relation to its proton-rich aqueous surroundings is detected. The apparatus comprises at least one transmission coil for exciting the nuclear resonance by means of an alternating electromagnetic field and comprises detection means for detecting nuclear magnetic resonance signals. The transmission coil generates conditions in the aqueous surroundings in which water proton nuclear magnetic resonance occurs in a volume region of more than 50 cubic meters, preferably considerably more than 1000 cubic meters of water. The volume region is monitored for the presence of nuclear magnetic resonance signals and a predetermined decrease in such resonance signals is detected.

50 Claims, 9 Drawing Sheets

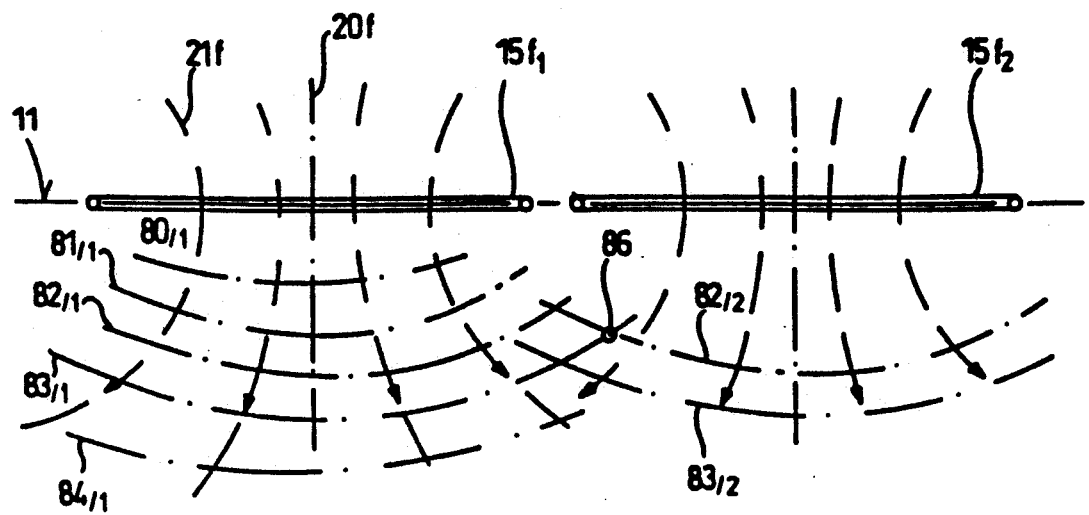
Fig.16
Fig.17
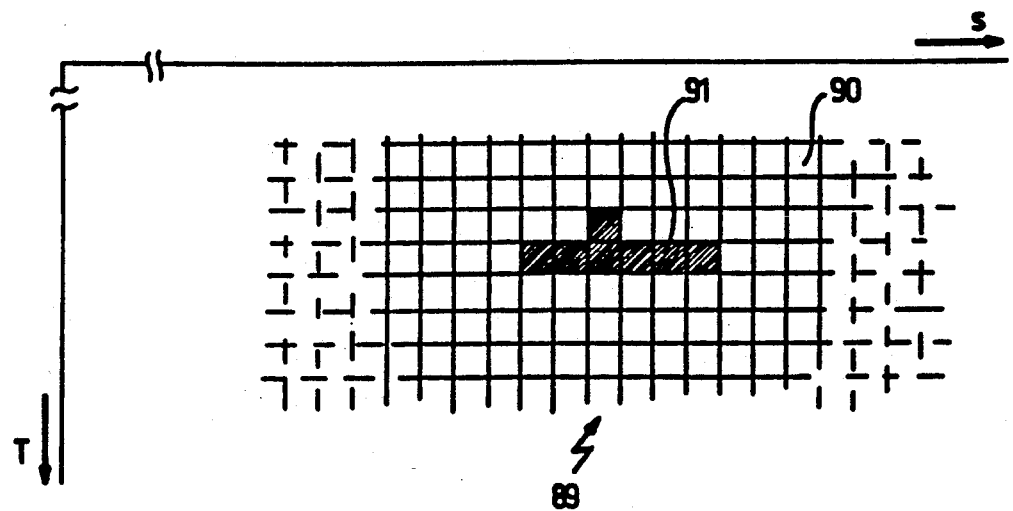

METHOD AND APPARATUS FOR LOCALIZING SUBMARINES

The invention relates to a method to localize proton-poor objects which are situated in aqueous surroundings, in particular to locate submarines or sea mines in an ocean or in an inland water, wherein a magnetic disturbance is detected which is caused by the object in relation to its surroundings, making use of nuclear magnetic proton resonance.

The invention is further related to an apparatus to localize proton-poor objects immersed in water, in particular to detect submarines or sea mines, with at least one transmission coil to excite nuclear magnetic proton resonance by means of an alternating electromagnetic field and with receiving means to detect a resonance signal.

The invention is further related to using the method of nuclear resonance of protons.

This application is related to the following co-pending U.S. patent applications:

1) U.S. patent application entitled "METHOD FOR INFLUENCING AN ACOUSTIC SOURCE, IN PARTICULAR OF A SUBMERGED SUBMARINE, AND SUBMARINE", Ser. No. 07/614,300, filed Nov. 15, 1990, corresponding to International Application PCT/DE 90/00197;

2) U.S. patent application entitled "METHOD AND APPARATUS FOR REDUCING ACOUSTIC EMISSION FROM SUBMERGED SUBMARINES", Ser. No. 07/602,310, filed Nov. 15, 1990, corresponding to International Application PCT/DE 90/00192;

3) U.S. patent application entitled "UNDERWATER VEHICLE WITH A PASSIVE OPTICAL OBSERVATION SYSTEM", Ser. No. 07/602,319, filed Nov. 15, 1990, corresponding to International Application PCT/DE 90/00196;

4) U.S. patent application entitled "METHOD FOR OPERATING SUBMERGED SUBMARINES AND SUBMARINE", Ser. No. 07/602,317, filed Nov. 15, 1990, corresponding to International Application PCT/DE 90/00194; and 5) U.S. patent application entitled "METHOD AND APPARATUS FOR REDUCING ACOUSTIC EMISSION FROM SUBMERGED SUBMARINES", Ser. No. 07/614,200, filed Nov. 30, 1990, corresponding to International Application PCT/DE 90/00195.

Each of the above-identified applications is assigned to the Assignee of the present application, and the disclosures thereof are hereby incorporated by reference into this application.

In connection with submarine combat, active as well as passive systems are used for localizing submarines.

In the active systems (e.g. SONAR) a search signal is emitted from on board the searching vehicle, for example a frigate, in general an acoustic signal in the sonic or infrasonic range. These acoustic signals are reflected off the surface of the submarine and reach receivers on board the search vehicle, such that with appropriate evaluation methods the position of the submarine can be determined from these detected signals.

To protect submarines from such active localization methods, furnishing the submarine with a coating on its outer hull which absorbs, as well as possible, the impinging acoustic signals is known in the art.

It has also been proposed to reduce turbulent flow around submerged parts by the addition of chemical additives (DE-A 23 18 304).

On the other hand, the passive localization methods use physical phenomena which are caused by the submarine itself. For example it is known in the art of locating submarines to use the fact that the metallic parts of the submarine disturb the earth's magnetic field. Therefore, localization probes are known which are based on the principle of nuclear magnetic resonance and which are towed by ships or aircraft on a long line over the ocean regions to be searched in order to detect distortions in the earth's magnetic field.

A further passive localization method, as described e.g. in EP Patent 63 517, EP-A 120 520 and EP Patent 213 418, is based on the measurement of acoustic signals which are emitted by the submarine. Namely, a submarine emits sound waves into the surrounding sea water to that extent that moving parts inside the submarine transmit vibrations to the hull. Primarily, measurable acoustic signals are created by moving drive elements of the submarine, that is, produced from the rotating parts of the propulsion motor and from the shaft, however, the rotating propeller and the cavitation produced by the propeller must also be considered as sound sources. Finally, acoustic signals are also produced by activating the elevator or depth rudder, by releasing air and by shifting trim loads, which can be monitored with appropriately sensitive passive localization systems on board modern frigates.

In this context relating to submarines with nuclear propulsion, there is the additional characteristic feature that nuclear reactors as used on board submarines are usually equipped with periodically operated control rods. The control rods are moved in the reactor container with a given frequency, whereby the penetration depth of the control rods is adjustable, so that in this way the power supplied by the nuclear reactor can be adjusted. However, as a consequence of the periodic movement of relatively large masses a relatively intense acoustic signal is also created, which can be used to locate such submarines with nuclear propulsion.

On the other hand, it is known that with modern acoustic localization systems becoming more and more sensitive, sound which is present in the surroundings of the submarine has to be considered to an increasingly larger extent. This natural sound is essentially produced by sea currents, waves, schools of fish etc..

In operating passive acoustic localization systems this environmental sound manifests itself as noise, which may, depending on the environmental conditions, take on a uniform or an irregular frequency distribution.

From DE-A 34 06 343 a method is known in the art with which acoustic signals from submarines may be recognized whose intensity is only slightly above the noise level of the surroundings.

From U.S. Pat. No. 4,766,385 an underwater localization device to track down sea mines buried in the sea bottom is known in the art. The localization device consists of an unmanned underwater vehicle, rope-towed but having independent propulsion, and which is equipped with a proton magnetometer to detect the presence of sea mines in the earth's magnetic field.

From EP-A 237 323 a method is known to measure bore holes for the oil industry. In this method, a nuclear magnetic resonance probe is lowered into a bore hole to perform nuclear magnetic resonance measurements outside the probe, i.e. in the earth surrounding the bore hole. In doing this, the chemical composition of the surrounding earth is analyzed with the aid of nuclear magnetic resonance, e.g. to detect the presence of hydrocarbons.

Finally, from DE-A 36 90 746 a device to measure parameters of deposits of subterranean minerals is known in the art, whereby a wire loop is situated at the surface of the earth and nuclear magnetic resonance is excited in a region below the wire loop by creating an alternating magnetic field by means of the wire loop which, in connection with the earth's magnetic field, excites nuclear resonances in the earth region below the wire loop. In this way, certain minerals inside the measured region shall be detected.

The known methods and devices, as far as they are intended for the location of submarines, sea mines etc., have, however, the disadvantage that either close proximity to the object to be located is required or that a localization from larger distances is not possible using a stationary measuring device, rather that several measurements have to be undertaken by shifting the measuring device in order to enable a precise three-dimensional localization of the searched object. In particular with moving objects like submarines, this is of considerable disadvantage, since in this case, if only one measuring device is available and has to be shifted within the measuring range, the position of the object to be located may have changed considerably in the meantime.

As far as the known methods and devices are suited to detect nuclear magnetic resonance outside a laboratory, the earth's magnetic field is always used as the constant magnetic field, and spectroscopic, i.e. analytical measurements are also performed, whose measured region depends on the respective position of the measuring device. This means that these known devices and methods are completely unsuitable for the three-dimensional localization of either moving objects such as submarines, or fixed objects such as sea mines.

Accordingly, it is the object of the invention to provide a method and a device of the above mentioned kind, to avoid the above-mentioned disadvantages and to enable, in particular, a precise multi-dimensional localization, including imaging, allowing identification of the searched object. Above all, localization of those objects which show no or only a virtually unmeasurable ferromagnetism shall also be made possible.

This object is achieved according to the above mentioned method by providing conditions for the occurrence of nuclear magnetic resonance of water protons within a volume of water, by monitoring the volume with respect to the occurrence of resonance signals and by detecting decreases in the resonance signals.

In accordance with the above mentioned device, the object of the invention is achieved by designing and positioning the transmission coil such that a volume of more than 50 cubic meters, preferably far more than 1000 cubic meters, of water can be covered by the alternating electromagnetic field and that the detecting means include a unit to detect a predetermined decrease in the resonance signal.

Finally, the object of the invention within the context of the above mentioned application is also achieved by using the method of nuclear magnetic proton resonance to detect, on a macroscopic scale, proton-poor regions in proton-rich surroundings, in particular to locate submarines or sea mines in an ocean or in inland waters.

In this way, the object of the invention is completely achieved.

In contrast to the above mentioned methods which are known in the art, or the respective corresponding devices, a nuclear magnetic resonance is not only effected within a small sample of e.g. some cubic centimeters of sample substance, which is placed on board of the towed probe, rather large scale nuclear resonance is created in a macroscopic region with dimensions of several tens, hundreds or thousands of meters, and the total signal of excited water protons is detected and analyzed. If a proton-poor object, e.g. a metallic submarine or a metallic sea mine, enters the volume region homogeneously filled with proton-rich Water which is being surveyed, this may easily be recognized from the decrease in the detected proton resonance signals, since these signals decrease to an extent corresponding to the ratio of the volume of the object to the volume of the volume region. In contrast to prior art, it is not required that the object itself is more or less ferromagnetic, all that matters is that the object is proton-poor relative to water, which is the case for most materials used in military applications. In the following, we define "proton-poor" as the property of materials to provide no distinct proton signal. The relaxation times of the material shall therefore be on the order of seconds.

As a consequence, the method and device according to the invention may be used to track arbitrary proton-poor objects in proton-rich surroundings, i.e. also to search for mines, to locate enemy combat divers with corresponding diving equipment, to locate torpedos and the like.

In a preferred embodiment of the device according to the invention, the transmission coil is situated in an ocean or an inland water and is connected to a water-craft equipped with transmission and receiving means.

This measure has the advantage that by towing the transmission coil along a predetermined course, a systematic search for enemy submarines, sea mines or the like, e.g. in predetermined map sectors, can be performed.

This is particularly applicable if the water-craft is a surface-bound ship, in particular a frigate, since in this case the search for enemy submarines may directly be combined With defense measures against these submarines.

In a further embodiment of the device according to the invention, the transmission coil is, in contrast, situated in or above an ocean or inland water and is connected with an air-craft equipped with transmission and receiving means.

This measure has the advantage that geographically separated map sectors of the ocean or inland water can be searched in rapid time sequence, whereby the aircraft, e.g. a helicopter or a seaplane, takes the transmission coil on board each time after searching a first map sector and flies to another geographically distant map sector.

Preferably, means to tow the transmission coil parallel to the sea or inland water surface along a predetermined course can be provided for in the cases mentioned above.

This measure has the advantage that predetermined map sectors can be searched in the way already described either from a position above or from a position below the ocean surface.

Alternatively however, it is possible to provide means to tow the transmission coil parallel to a sea or inland water bottom along a predetermined course.

This use of the device according to the invention is particularly suited for cases where objects located in or at the sea bottom, in particular mines fixed at such a location, shall be searched for.

In a further group of embodiments of the device according to the invention, the transmission coil is fixed in an ocean or an inland water and is connected to stationary transmission and detection means.

This measure has the advantage that, in a simple manner, a stationary survey of coast sectors, ports, mouths of rivers, straits and the like is possible, since the stationary transmission coil enables localization and if necessary identification of all proton-poor objects, i.e. all conventionally built underwater or surface watercraft, combat divers, torpedos or the like.

In this context it is particularly preferred if the transmission coil is designed as a resonance arrangement with dimensions corresponding to multiples of a quarter wavelength of the alternating electromagnetic field. This configuration is particularly suitable for the survey of straits.

The advantage of this measure is that the resonance arrangement permits a particularly sensitive measurement, since disturbances of a resonance condition can be particularly easily detected.

In modifications of the embodiments with stationary transmission coil mentioned above, this coil can either be buried in the sea bottom or float in the sea, depending on the individual case requirements.

In a further group of embodiments the transmission coil is also part of the receiving means.

This measure has the advantage that only one single coil need be used which serves at the same time as transmission coil and as detection coil. The apparative expenditure, in particular With the mobile systems substantiated above, is therefore markedly reduced.

In a further group of embodiments, the receiving means include a receiving coil separated from the transmission coil.

This measure has the advantage that more sensitive measuring arrangements can be realized since by separating the transmission means from the receiving means any cross talk can be drastically reduced. In this respect, one has to realize that the very large measuring arrangements which are of interest in the present context require, in turn, correspondingly large levels of transmission power to cover extensive volume regions. On the other hand, the resonance signals received may be of very small amplitude so that separating the transmission means from the receiving means may lead to a distinct improvement in the detection limit.

In this case, a particularly positive effect is achieved if the detection coil is located next to the transmission coil and if the plane of this coil is essentially perpendicular to the plane of the transmission coil.

This measure has the advantage that a so-called induction configuration is created whereby the transmission coil is geometrically decoupled from the detection coil and that only the resonance signals coming from the protons are induced in the detection coil.

In a further particularly preferred embodiment of the device in accordance with the invention, the transmission coil is arranged at an angle different from 90 degrees with respect to the earth's magnetic field.

This measure takes advantage of the fact that, in a nuclear resonance experiment, the direction of the alternating magnetic field should be perpendicular to the direction of the uniform magnetic field. On the other hand, in coil configurations of interest in the present context and having extremely large dimensions, no alternating electromagnetic fields can be produced whose lines of force have a uniform direction within the measurement region. Therefore, in all transmission coils which are of interest here, there will always be alternating electromagnetic field components perpendicular to the direction of the earth's magnetic field if the earth's magnetic field is used as the homogeneous field for the production of the nuclear resonance. The effect being measured will be maximized if the transmission coil is arranged at an angle different from 90 degrees with respect to the direction of the earth's magnetic field, particularly at an angle of 0 degrees since in this case the components of maximal strength of the alternating electromagnetic field are perpendicular to the earth's magnetic field.

The utilization of the earth's magnetic field as homogeneous field to produce the nuclear magnetic resonance has the additional advantage that no additional field-generating means are required since the effect of the earth's magnetic field is present everywhere on earth and only the inclination of the field with respect to the earth's surface has to be taken into consideration. homogeneous enough that it can be considered constant within the searched volume regions.

On the other hand, in order to generate a constant magnetic field, a further group of embodiments provides for field means which are formed and arranged in such a way that the constant field covers the volume region.

This measure has the advantage that the nuclear resonance in the volume region which is to be searched can be generated independently of the corresponding earth's magnetic field so that, with correspondingly greater constant field strengths, an increase in measuring precision and thereby an increase in the range of the device according to the invention can also be achieved.

However, it is also possible and particularly advantageous to use the field means only in order to generate a field which overlaps the earth's magnetic field and is of approximately equal order of magnitude.

In a variation of the embodiment described above the field means are e.g. formed as gradient means and generate a constant field in the volume region with a defined spatial variation of the field strength.

This measure has the advantage that a multi-dimensional encoding of the volume region being searched can be carried out in which, either statically or in a time varying fashion, a constant magnetic field with varying field strength is imposed on each point within the volume region, which at the corresponding points leads to the generation of nuclear resonance even for differing experimental conditions.

It is particularly advantageous if in this case the field means are realized as a field coil, since in a field coil a multitude of spatial profiles of the magnetic field strength can be generated by correspondingly varying excitation, dimensioning, and positioning of the field coil.

In an embodiment of this variation the coil plane of the field coil is essentially perpendicular to the coil plane of the transmission coil.

This measure has the advantage that the field coil, when it is used to generate the constant field, provides a maximum of signal yield since, in the classical nuclear resonance experiment, the transmission coil must always be arranged perpendicular to the direction of the constant field.

In further variations of these embodiments the field means are formed from permanent magnets.

This measure has the advantage that with permanent magnets of appropriate dimensions, constant fields can be generated even in large volume regions without requiring a separate energy source.

In further embodiments of the invention the coils are formed as circular coils or with a polygon-shaped coil plane or formed as a group of individual coils.

These measures have the advantage that, depending on the prevailing operating conditions, the desired alternating electromagnetic fields or constant fields can be generated with different geometries or that the resonance signals can be received with different coil geometries. However, it is understood that, in addition, other coil shapes can also be used, e.g. saddle coils or the like.

In this context, it is further preferred that the coils are provided with a ferromagnetic core.

This measure has the advantage that the intensity of a generated alternating or constant field can be correspondingly raised and the sensitivity of the receiver coils can, through this measure, also be increased.

Furthermore, it is particularly preferred that the coils are wound from a superconducting wire.

This measure has the advantage that magnetic fields of large intensity can be generated with little effort regarding electrical excitation.

In this embodiment, it is particularly preferred that the superconducting wire is made from a high temperature superconductor.

This measure has the advantage that by using in particular ceramic superconductors, the coils can be run at temperatures far above the temperature of liquid helium so that a mobile application of this type of configuration also becomes possible.

A positive effect is also achieved if the coils have a coil area of more than 10 square meters, preferably considerably more than 100 square meters.

Given these coil dimensions and corresponding magnetic excitation (Ampere turns), regions of the above mentioned kind up to several thousands of cubic meters of water can be covered by alternating or constant fields.

It is furthermore preferred that the coils have differing coil areas.

This has the advantage that for the various coils (transmission coils, receiving coils and field coils) different coil areas can be used depending on the physical requirements. In coil systems towed on the surface of an ocean, this has the additional advantage that e.g. a surface coil of very large dimensions can be used whereas the additional immersed coils which are arranged perpendicularly to said surface coil can have smaller coil areas in order to reduce the hydrodynamic resistance of the coil configuration and the sensitivity to changes in orientation of the coils while being towed.

In a further group of embodiments, the receiving means include scanning means for the purpose of localized detection of the resonance signal.

This measure has the advantage that by scanning through a plurality of measurements, a determination of the position of the object searched for becomes possible.

In a specific variation of this embodiment, the scanning means act in combination with the towing means for the transmission coil and register the detection of the pre-defined decrease of the resonance signal as a function of the position of the transmission coil.

This measure has the advantage that, e.g. when towing a coil system, the resonance signal is recorded as a function of the corresponding position of the search vessel along its course so that, by detection of a predefined decrease in the resonance signal, an assignment to a local position on the course becomes possible. This leads to a one-dimensional localization of the objects.

In other variations on the embodiment, the scanning means include, in contrast, nuclear magnetic resonance imaging means which register the detection of the predetermined decrease of the resonance signal separately for approximately point-shaped segments of a multi-dimensional grid of coordinates.

These measures have the essential advantage that e.g. even in case of a stationary coil arrangement, through varying electrical parameters, a point-by-point inspection of the volume range is possible and one can sequentially measure whether or not all segments of the volume region provide a resonance signal corresponding to a complete filling of the volume region with signal-emitting protons. In this manner, an image of a proton-poor object can be generated in a multidimensional grid of coordinates in which those volume segments are marked wherein the resonance signal differs in a downward direction from the resonance signal of the proton-rich water surroundings. In this way, a localization of the objects in three spatial coordinates can be effected, including the diving depth as well, and through appropriate high quality image generation, identification of the objects is even possible. In locating submarines the exact position of the submarine with respect to surface coordinates and diving depth can be found in this manner, and, if occasion arises, by appropriate accurate imaging, an identification of the submarine's construction-type can be performed so that appropriate defence measures can be undertaken.

In a first practical variation of this embodiment, the imaging means include an impulse generator permitting control of a transmitter for the transmission coil in such a way that the transmitter emits a gated CW signal of adjustable amplitude and duty cycle.

These features take advantage of the fact that the pulsed nuclear resonance so-called 90 degree or 180 degree pulses can be generated by appropriate adjustment of the amplitude and pulse length of the CW signal gated according to a square wave or an appropriate envelope. If, for example, the amplitude of the gated CW signal is varied, 90 degree or 180 degree pulses can be generated in defined depths of the ocean. If these pulses are combined to form spin-echo-pulse sequences, it can be determined, in a simple fashion, whether or not a proton-poor object is present at a given ocean depth.

In a further variation, the imaging means include a power supply for adjusting defined gradients in a constant field generated in the volume region.

This measure has the advantage that, in the way already alluded to above, a magnetic encoding of the volume region is effected by imposing a constant magnetic field of differing intensity at each point of the region so that localized nuclear magnetic resonances can be generated at each of these points within the region in that the remaining parameters of the alternating electromagnetic field can be varied appropriately.

In a further variation, the imaging means include a sweep unit for a transmitter driving the transmission coil.

This measure has the advantage that either, by continuously sweeping the frequency of the alternating electromagnetic field, nuclear resonances can also be excited at defined individual points or along individual planes of the volume region, since, for a given frequency, the ratio of magnetic field strength to frequency corresponds to the gyromagnetic ratio of protons only in these points or planes, or that, on the other hand, the entire proton system is excited by broad-band irradiation, and that, on the receiver side, the resonance signals can be processed in a highly sensitive fashion via Fourier transformation.

In a further variation of this embodiment, the sweep unit step-wise varies the frequency of the transmitter in such a way that, in a single resonance system, different resonance modes are excited.

These measures are particularly appropriate for such configurations in which the elements of the resonance system e.g. are arranged on both sides of a strait at a distance which is a multiple of a quarter wavelength of the alternating electromagnetic field or have a corresponding length. In a system formed in such a way and capable of resonating, resonances can be generated in different resonant modes, in which the distribution of the field lines of the alternating electromagnetic field is a function of the respective oscillation mode. In so doing, a spatial resolution of the volume region can also be achieved which, in turn, can be processed into an image.

In a further variation of the embodiment, the imaging means include devices for changing the position of the transmission coil, whereby the transmission coil generates an alternating electromagnetic field with defined spatial variation of the field strength.

This measure has the advantage that the, in practice unavoidable, inhomogeneity of the transmission coil is utilized to successively impose field lines of differing magnetic field directions and intensities onto different successive points of the volume region through appropriate position changes, e.g. through tilting of the transmission coil.

Accordingly, the same is true for another variation, in which the imaging means include devices for changing the position of field means, the field means generating a constant field with defined spatial variation of the field strength.

Finally, in the case of still another variation, the imaging means include a multitude of transmission and detection coils that are individually controllable.

This measure also has the advantage that by successively driving either one or differing combinations of several coils, points in the volume region can be exposed to varying field strengths of the alternating electromagnetic or constant field.

In further embodiments of the invention, the unit for the recognition of the predetermined decrease of the resonance signal is adjusted such that an alarm indicator is triggered if the decrease corresponds to a proton-poor volume in the volume range which is approximately equal in volume to that of a submarine or, in case of another variation, to a sea mine.

This measure has the advantage that by setting various threshold values, a crude selection regarding the kind of recognized object can already be made.

In the embodiments substantiated above it was assumed that nuclear proton resonances are excited in the water of the volume region, so that by making use of the earth's magnetic field as the constant field, the alternating electromagnetic field would have to be given a frequency of approximately 2 kHz in order to correspond to the gyromagnetic ratio of protons.

Further advantages can be extracted from the description and the accompanying drawings.

It is understood that the features mentioned above and those which are to be explained below are applicable not only in the respective given combinations but also in other combinations or by themselves without departing from the scope of the present invention.

Embodiments of the invention are shown in the drawing and are explained in detail in the following description. Shown are:

FIG. 1—A schematic perspective representation of a combat situation, in which a frigate locates a submarine submerged in an ocean with respect to surface coordinates and diving depth.

Figure 2:
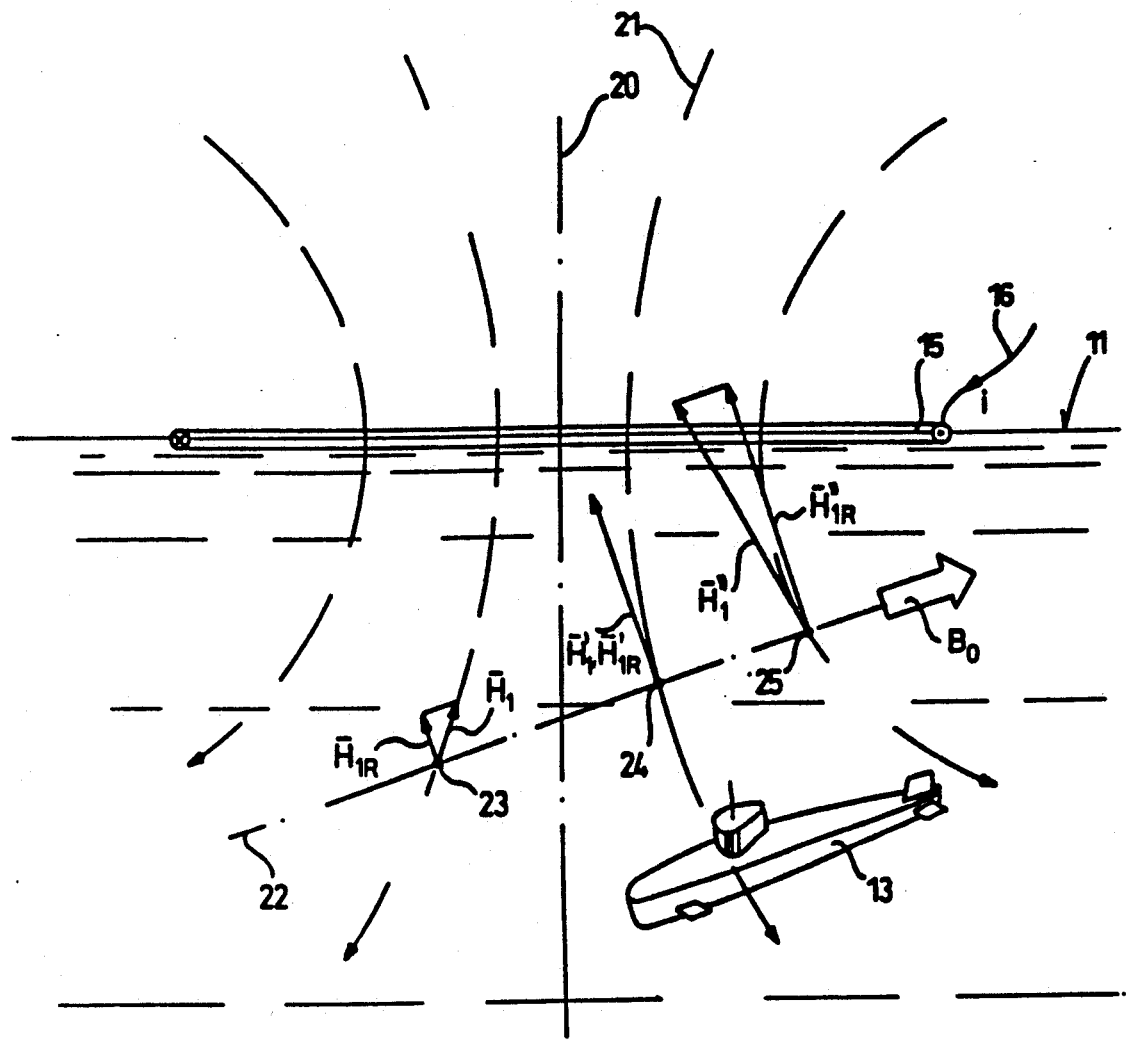

FIG. 2—A schematic side view of the situation of FIG. 1 to explain the active magnetic fields.

Figure 3:
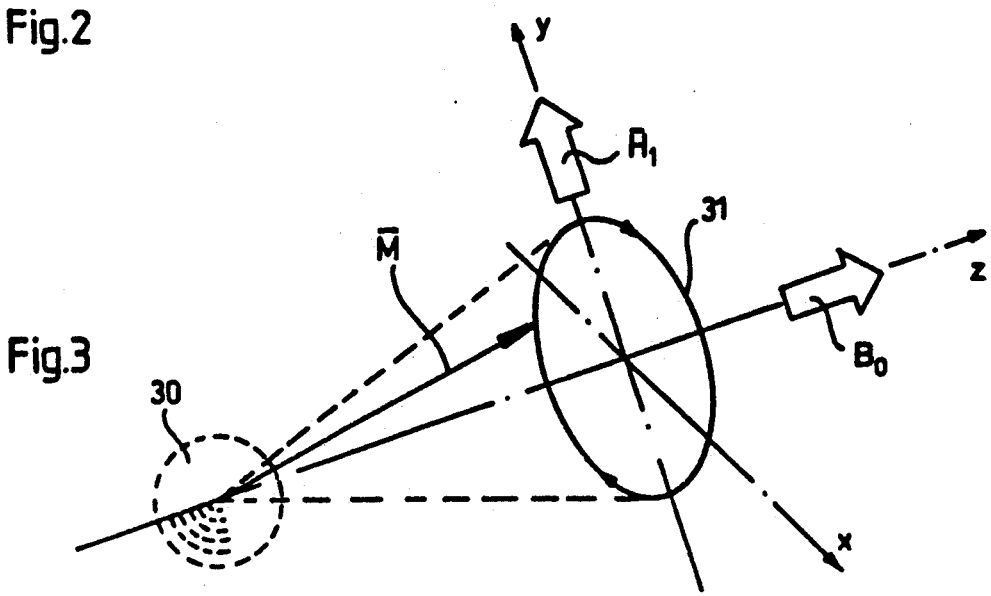

FIG. 3—A representation to explain nuclear magnetic resonance.

Figure 4:
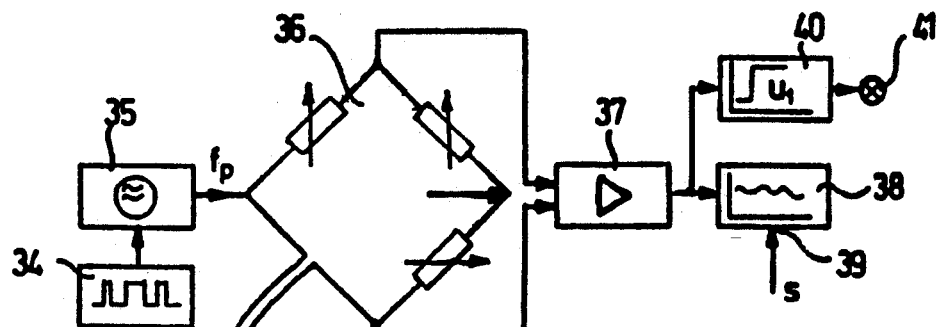

FIG. 4—A first block diagram of a nuclear resonance apparatus in bridge connection according to the invention.

Figure 5:
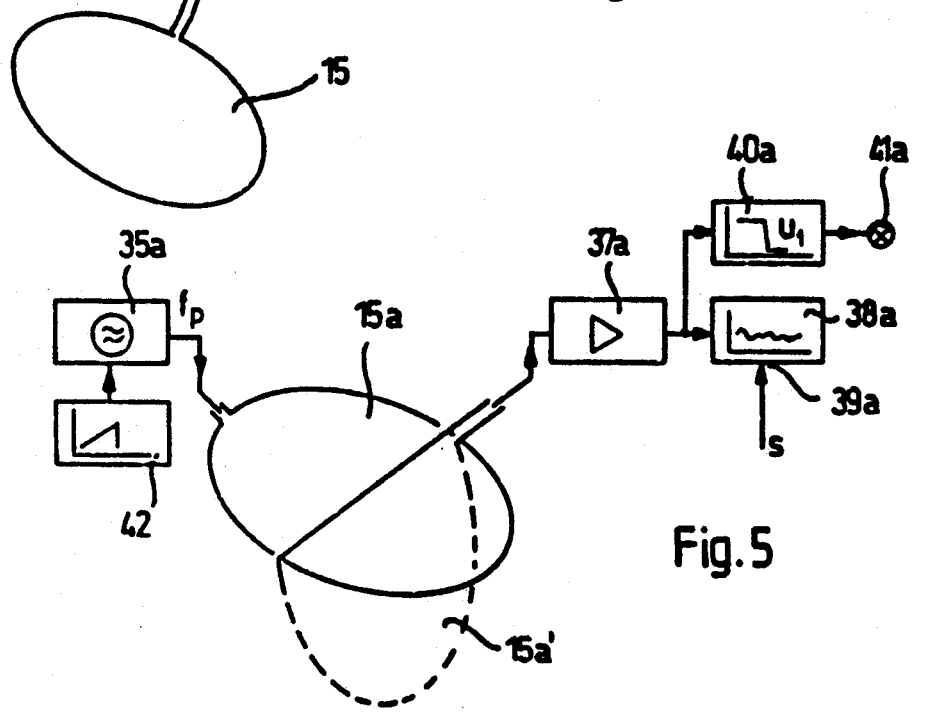

FIG. 5—A second block diagram of a nuclear resonance apparatus in induction configuration according to invention.

Figure 6:
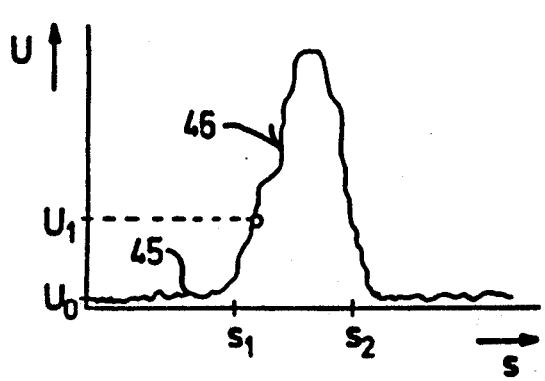

FIG. 6—A graphic representation of a nuclear resonance signal measured with the aid of the arrangement according to FIG. 4.

Figure 7:
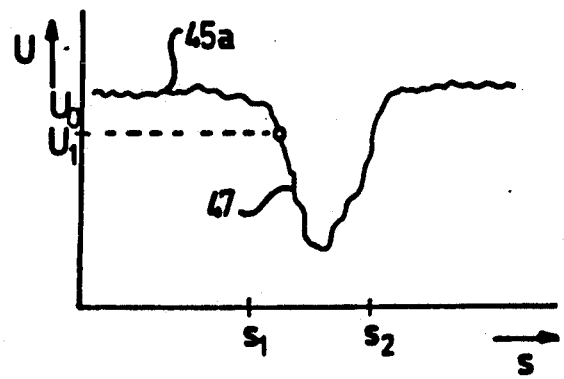

FIG. 7—A graphic representation of a NMR signal measured with the aid of the arrangement according to FIG. 5.

Figure 8:
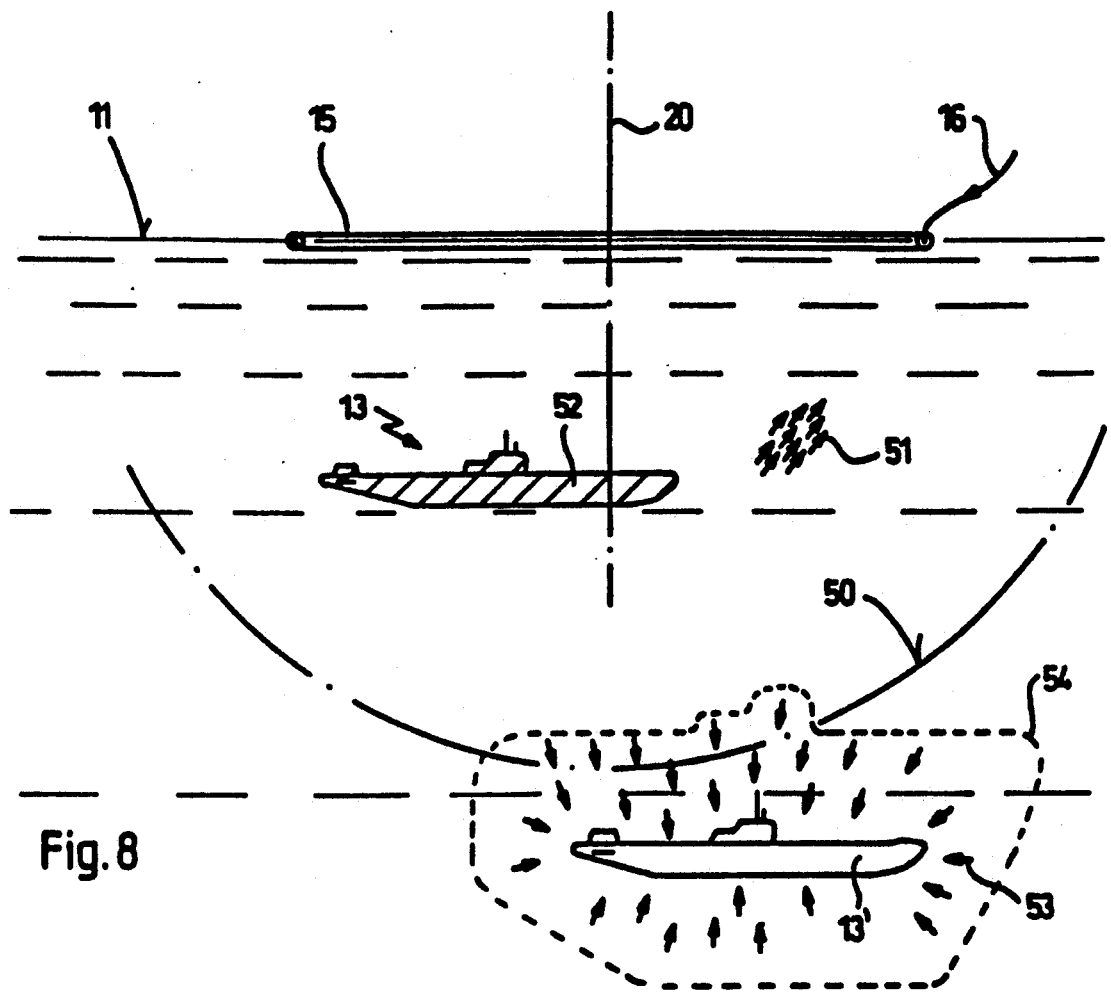

FIG. 8—A representation similar to FIG. 2 in order to explain the range of an apparatus in accordance with the invention.

Figure 9:
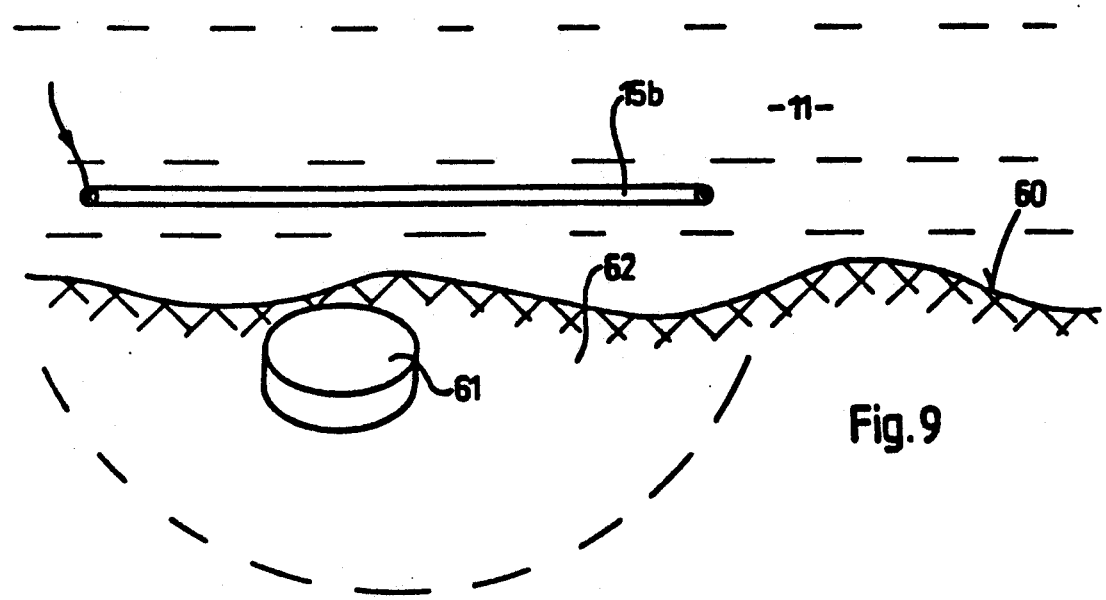

FIG. 9—A further representation similar to FIG. 2 in order to explain the localization of a buried sea mine according to the invention.

Figure 10:
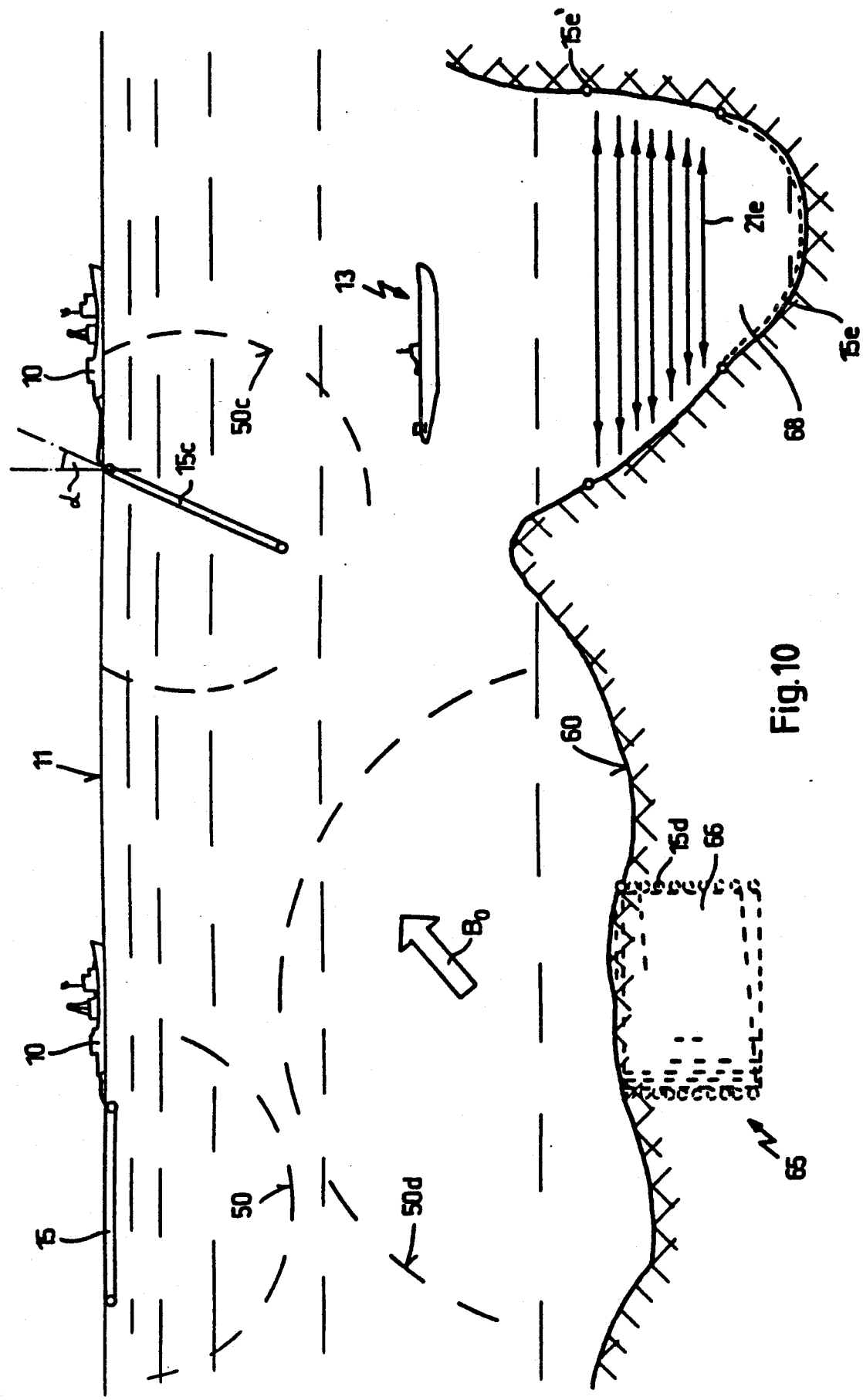

FIG. 10—A further representation similar to FIG. 2 in order to explain different arrangements according to the invention of devices in an ocean.

Figure 11:
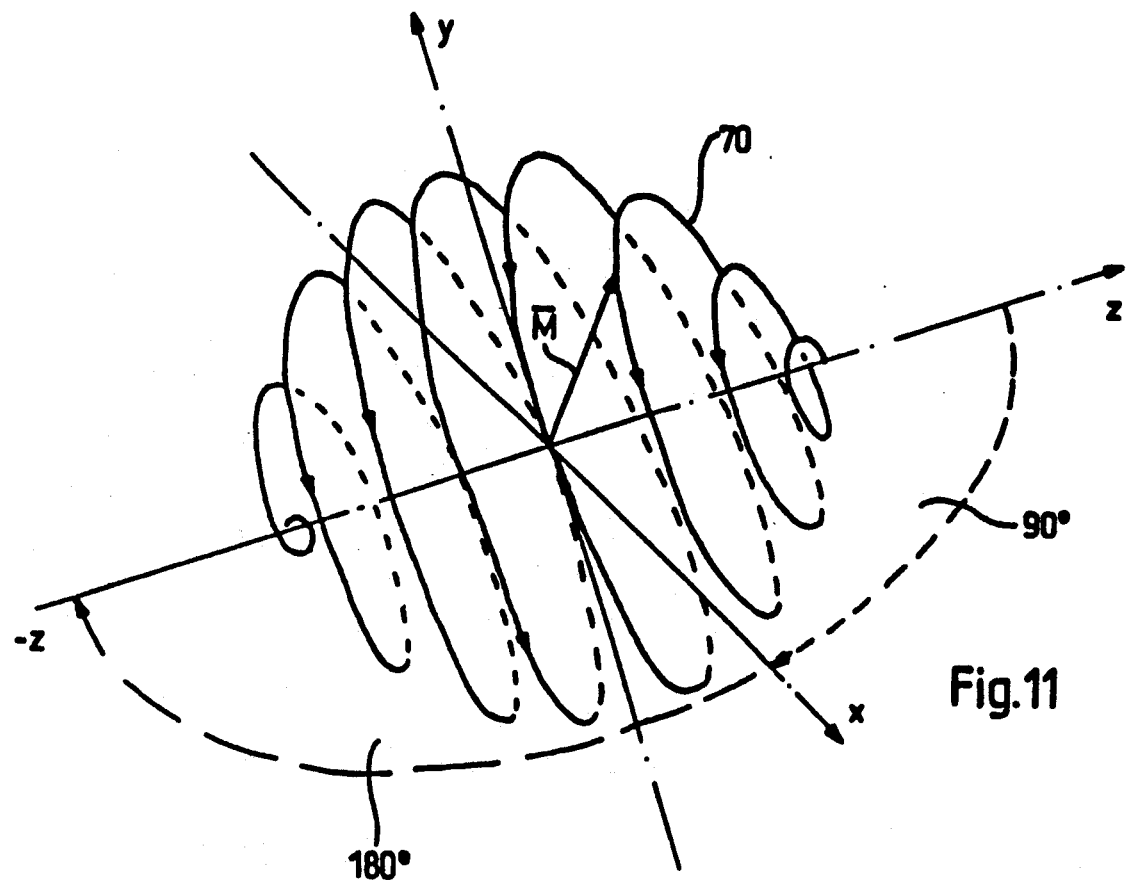

FIG. 11—A representation in order to explain a pulsed nuclear resonance.

Figure 12:
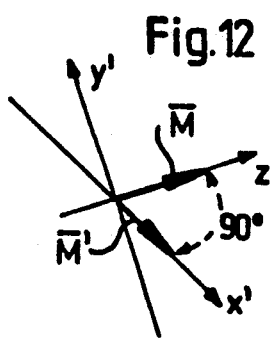
Figure 13:
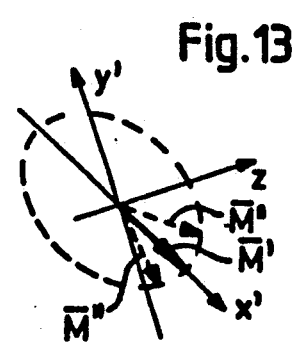
Figure 14:
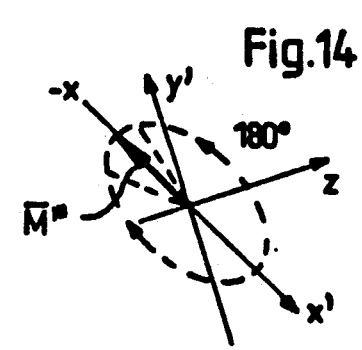

FIG. 12 to 14—Vector diagrams in order to explain a nuclear resonance spin echo experiment.

Figure 15:
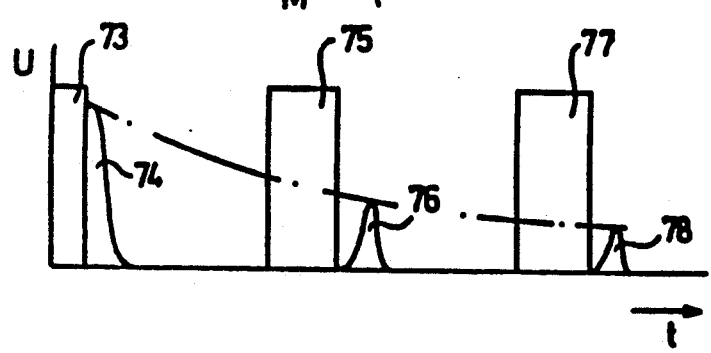

FIG. 15—A graph of the time dependence of a pulse program for generating the experiment illustrated by FIG. 12 to 14.

FIG. 16—A further representation similar to FIG. 2 in order to explain a depth encoding with the aid of a variation of the field strength of an alternating electromagnetic field.

FIG. 17—A representation in order to explain a two-dimensional imaging according to a method in accordance with the invention.

Figure 18:
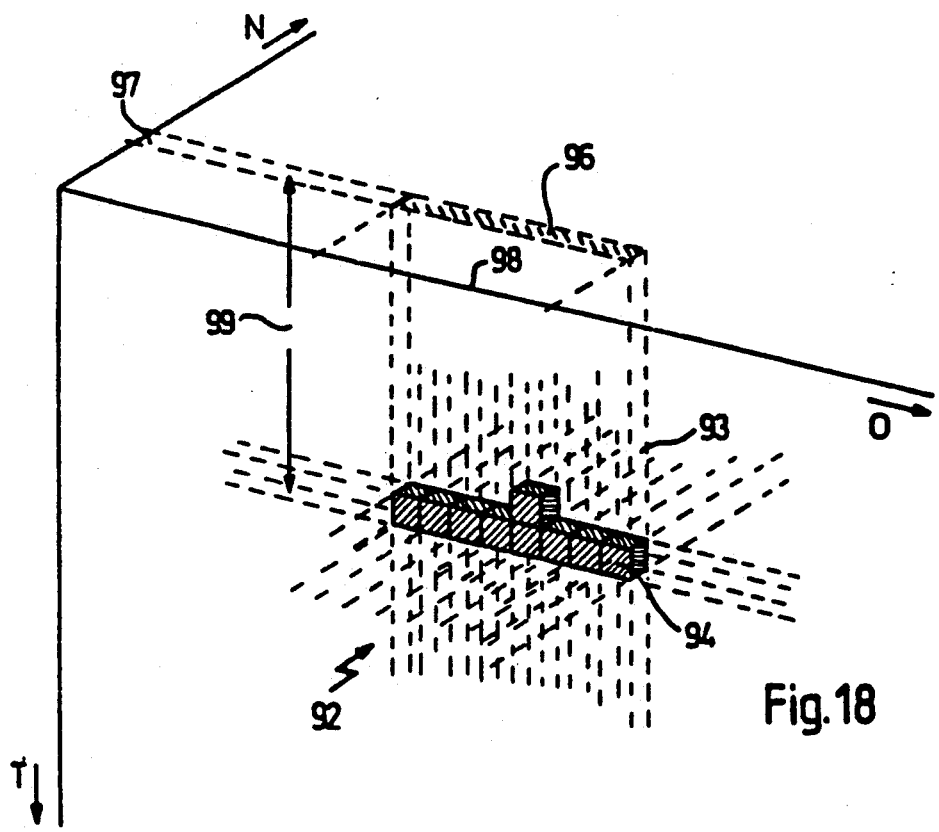

FIG. 18—A representation similar to FIG. 17, however for a three-dimensional imaging.

Figure 19:
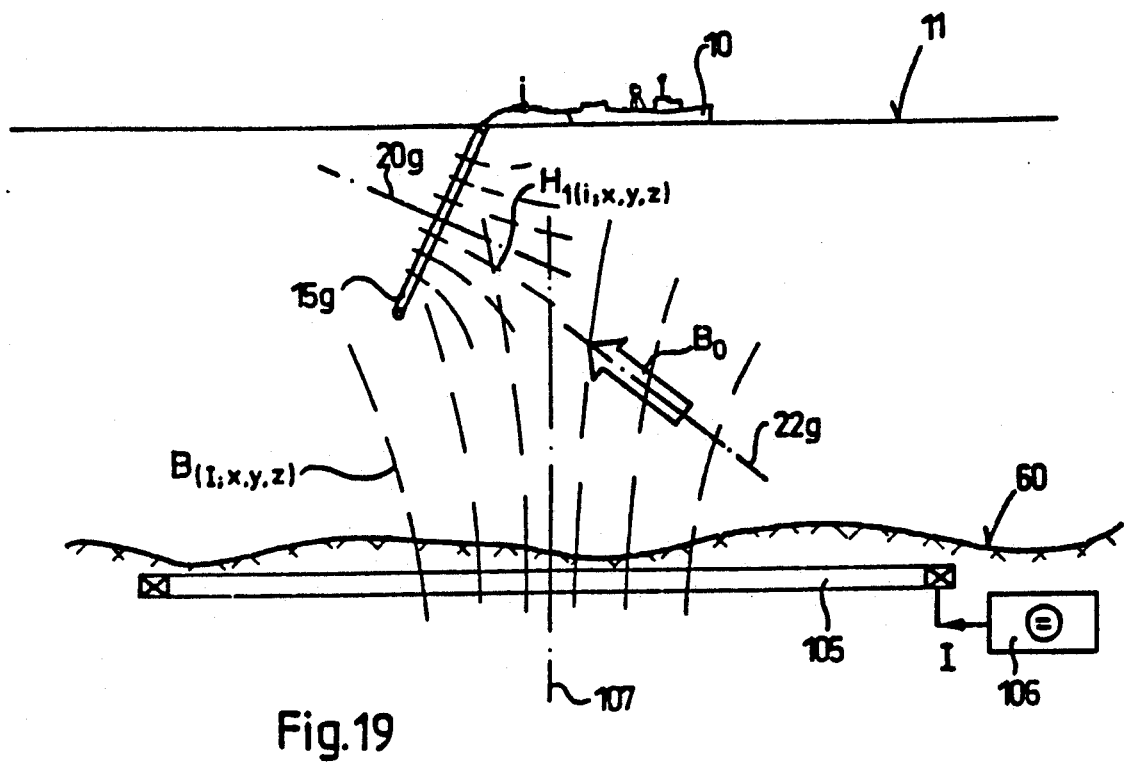

FIG. 19—A further representation similar to FIG. 2, however, for the case of introduction of an additional static magnetic field.

Figure 20:
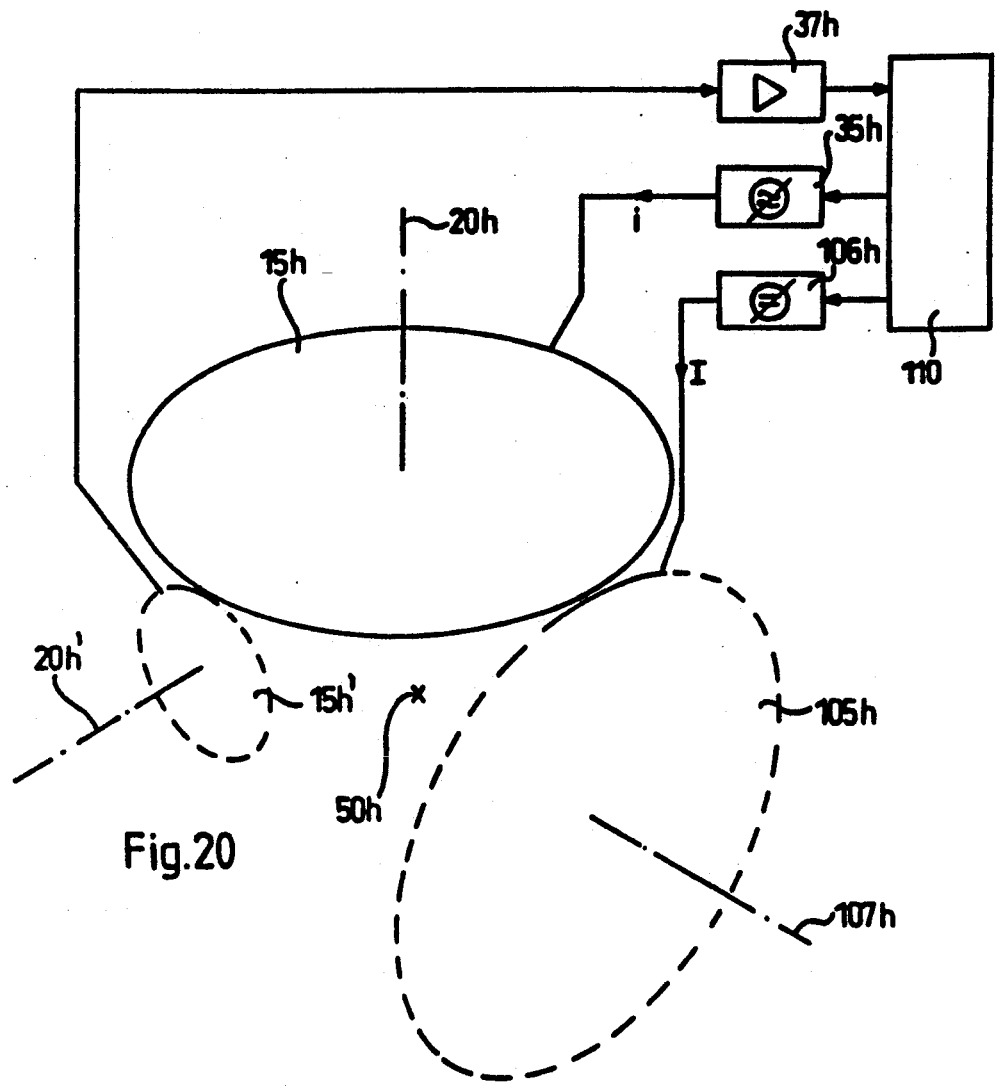

FIG. 20—A representation in order to explain a three-coil arrangement applied according to the invention.

Figure 21:
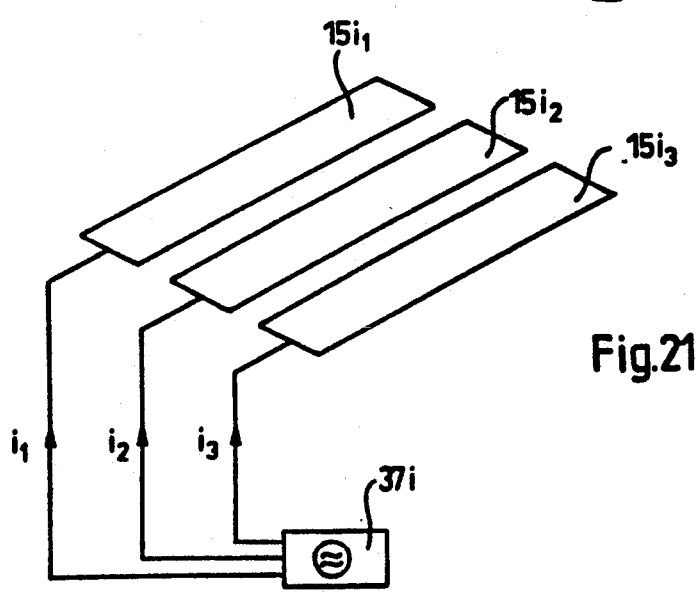

FIG. 21—A representation in order to explain a coil array applied according to the invention.

In FIG. 1, numeral 10 indicates a frigate as it can be used to locate and combat submarines or to locate and salvage sea mines or objects of that kind. The frigate 10 sails on an ocean 11 along a course s symbolized by an arrow 12. There is a submerged submarine 13 in proximity to the frigate 10 the position of which shall be determined in a coordinate system symbolized by 14 with respect to surface coordinates N, S, W and O as well as with respect to diving depth T. For this purpose, the frigate 10 has laid out a transmission coil which is linked to the frigate 10 by an appropriate cable 16 and which is towed by the frigate across a given search area along the course s.

The transmission coil 15 is floating preferably on or shortly beneath the ocean surface 11 and is, for this purpose, provided with appropriate buoyant bodies and means for maintaining a large span area which, for the sake of clarity, are not represented in detail in FIG. 1. It is understood that transmission coil 15 can also be carried and towed by one or several helicopters.

FIG. 2 shows, once more, the circumstances of FIG. 1, however in side view and one notices the transmission coil 15 with a vertically directed axis 20. The transmission coil 15 is fed with a high frequency current i via cable 16 so that the transmission coil 15 generates an alternating electromagnetic field with field lines 21 the corresponding complex field strength of which is indicated in FIG. 2 with $H_1$ at the corresponding vectors.

Additionally, the earth's magnetic field is active in the volume region represented in FIG. 2 which is symbolized by an arrow $B_0$ in FIG. 2. The earth's magnetic field $B_0$ in the volume region represented in FIG. 2 points in a direction 22 with an inclination relative to the earth's surface which depends on the geographical position of the corresponding volume region.

It is known in the art that the essentially homogeneous local earth's magnetic field has a magnitude of approximately 0.5 Gauss (50 microTesla). The inclination with respect to the earth's surface is dependent on the geographical latitude and varies between 0 degrees at the equator and 90 degrees at the magnetic poles of the globe.

The earth's magnetic field $B_0$ can therefore be used in order to generate a nuclear magnetic resonance of the protons i.e. the hydrogen atoms of the sea water 11. FIG. 3 shows an extremely schematic representation of such a proton 30, the magnetization vector M of which is aligned along the earth's magnetic field $B_0$ and precesses along a path 31 around this direction which coincides in FIG. 3 with a z-axis of an imaginary coordinate system. If an alternating electromagnetic field $H_1$ is applied in a plane x/y orthogonal to the z direction, as symbolized by an additional arrow in FIG. 3, the precession of all magnetization vectors M of all 10 protons 30 of a certain volume region can be synchronized. The frequency of the alternating electromagnetic field $H_1$ is determined by the strength of the active constant field, i.e. in this case by the earth's magnetic field $B_0$, namely via the so-called gyromagnetic ratio which characterizes the quotient of frequency and field strength for every type of nucleus which is nuclear resonance active. In the case of protons, the gyromagnetic ratio is approximately 4 kHz/G so that in the earth's magnetic field of 0.5 G there is a nuclear resonance frequency of about 2 kHz. This corresponds to a vacuum wavelength of approximately 150 km and/or a wavelength of 17 km in water, the dielectric constant of which can be taken to be about 9.

As already mentioned, the alternating electromagnetic field $H_1$ irradiated to excite nuclear resonance must be perpendicular to the direction of the existing constant field. Since the field lines 21 of the alternating electromagnetic field generated by coil 15 in FIG. 2 are curved, the individual projections of the field strength vectors $H_1$ must be taken into account at each point of the volume region.

In FIG. 2 it is recognizable, at a first point 23, that the projection of the field strength vector $H_1$ is only $H_{1R}$ since at the first point 23 the field line intersects the direction 22 of the earth's magnetic field $B_0$ at a relatively sharp angle. At a second point 24 however, the projection $H_{1R'}$ of the field strength vector $H_{1'}$ approximately coincides with the latter since at the second point 24 the field line 21 intersects the direction 22 at an angle of approximately 90 degrees. At a third point 25 the projection $H_{1R''}$ is again, however, smaller than the vector $H_{1''}$. However, the intensity of the projections $H_{1R}$, $H_{1R'}$ and $H_{1R''}$ increases from the first point 23 to the third point 25 since the intensity of the field strength of the electromagnetic alternating field $H_1$ increases as the coil is approached in the direction of the coil axis 20.

All in all, this means that, for a practically feasible irradiation of an electromagnetic alternating field $H_1$ with a defined spatial distribution of the field strength vectors, $H_1$ has to be calculated with respect to modulus, direction and phase.

FIG. 4 shows a block diagram with e.g. a transmitter 35 controllable by an impulse generator 34 feeding a bridge circuit 36 which exhibits adjustable and standardized complex impedances in three branches and, in the fourth branch, the transmission coil 15. In the transverse branch of the bridge circuit 36 there is an amplifier whose output is linked to a plotter 38 or another storing means into which a signal corresponding to course s can be introduced via an input 39. Furthermore, the output of amplifier 39 is connected to a trigger stage 40 which, in turn, activates an alarm indicator 41.

If an impulse generator 34 is used to excite pulsed nuclear resonances, as will be explained further below in connection with FIG. 11 to 15, it can be useful to provide for a switch in front of amplifier 37 in order to block the input of amplifier 37 during the pulse and to open it in the intervals between pulses.

FIG. 5 shows, in turn, a modified arrangement in which a sweep unit 42 controllable transmitter 35a solely supplies a transmission coil 15a. A detection coil 15a', galvanically separated from the transmission coil 15a, the plane of which is preferably arranged perpendicularly to the plane of transmission coil 15a, is, in turn, connected to an amplifier 37a followed by the switch elements already explained in FIG. 4.

The function of the arrangements according to FIG. 4 and 5 are as follows:

If in the arrangement according to FIG. 4, the transmission coil 15 which serves also as the detection coil is situated in ocean 11, proton resonances are excited in the surrounding sea water 11 around transmission coil 15 if, as described above, the frequency of transmitter 35 is adjusted to the proton resonance frequency $f_p$. Hereby, the complex impedance of transmission coil 15 is changed which leads to a corresponding detuning of the bridge circuit 36. By adjusting the complex reference impedances of bridge circuit 36, the voltage in the transverse branch can be adjusted to zero during the search cruise of frigate 10. In FIG. 6 this is represented by a nuclear resonance signal 45 which approximately exhibits an amplitude of 0. The diagram represented in FIG. 6 is registered by the plotter 38 from which it can be determined that there has been no change in the excited or received nuclear resonance signal up to course position $s_1$.

If, however, the submarine 13 enters into the volume region covered by the transmission coil 15, the received resonance signal is reduced accordingly since only a small volume of water is now proton-resonance excited. The submarine consists essentially of metal and enclosed air, i.e. of proton-poor or even proton-free material, so that the volume region occupied by the submarine 13 no longer contributes to the emission of a proton-resonance signal. The resonance signal received by the transmission/detection coil 15 is therefore reduced by an amount corresponding to the ratio of the volume of the region covered by transmission coil 5 to the volume of the submarine 13.

The detuning of the bridge circuit 36 produced by the submarine 13 entering the volume region covered by transmission coil 15 is clearly recognizable as an increase in FIG. 6. The increase 46 lasts until the course position $S_2$ at which the submarine 13 has left the volume region covered by transmission coil 15.

In the trigger stage 40, a trigger value $U_1$ of the voltage U in the transverse branch of the bridge circuit 36 can be given which leads to a triggering of the alarm indicator 41.

On the other hand, in the arrangement of FIG. 5, a maximal nuclear resonance signal is always induced in the detection coil $15a'$ which is arranged in an orthogonal position to the transmission coil $15a$, as indicated by a nuclear resonance signal $45a$ in FIG. 7 corresponding to a voltage $U_0$ at the terminals of the detection coil $15a'$.

If, however, the submarine 13 enters into the transmission range of coil $15a$, the nuclear resonance signal generated is reduced in the way already described in proportion to the volumes of the volume region and the submarine 13, and only a small voltage is induced in the detection coil $15a'$. This becomes noticeable in FIG. 7 by a dip 47 which lasts from the course position $s_1$ to the course position $s_2$. In this case, the trigger stage $40a$ will be adjusted in such a way that the alarm indicator $41a$ is triggered when the voltage goes below voltage $U_1$.

The pulse generator 34 in FIG. 4 as well as the sweep unit 42 in FIG. 5 can be used in order to generate, instead of a CW signal of constant frequency and amplitude, a gated CW signal or a frequency variable signal or a signal of variable amplitude or a noise signal or combinations of these signals as will be explained below with FIG. 11.

FIG. 8, in turn, shows a view similar to FIG. 2 and 50 indicates the volume region which can be covered with the aid of transmission coil 15. "Volume region" means here the space in the environment of transmission coil 15 in which a measurable nuclear resonance signal from the protons of the sea water 11 is generated and detected. Of course, the extent of volume region 50 depends, therefore, on the dimensions, the form, and the number of ampere windings of the transmission coil 15.

FIG. 8 indicates first protons 51 in the volume region 50 which are all aligned in the direction of the earth's magnetic field $B_0$ (see FIG. 2). Therefore, all of the evenly distributed protons 51 of volume region 50 contribute to the signal.

The submarine 13, in turn, represents a "proton hole" as symbolized by 52 since, at the location of the submarine 13, there is only proton-poor or proton-free material, in particular metal. Therefore, as already mentioned, there is a reduction in the nuclear resonance signal when the submarine 13 enters the volume S region 50, said reduction corresponding in first approximation to the quotient of the volumes of the volume region 50 and the proton hole 52.

However, even a submarine which is located at a small distance from volume region 50 as indicated by 13' in FIG. 8 also leads to a measurable effect within the volume region 50 if the material from which the submarine 13' is made causes a change in the earth's magnetic field $B_0$. Namely, in this case, the second protons situated in proximity to the submarine 13' indicated with 53 will enter out of resonance, in particular in narrow band pass measurements, since the resonance frequency of the protons is strictly proportional to the absolute magnitude of the field strength via the gyromagnetic ratio. In addition, the second protons 53 will, unlike the first protons 51, no longer orientate themselves strictly parallel to the direction of the earth's magnetic field $B_0$, but rather towards or away from the submarine 13' leading to a picture which depends on the shape of submarine 13'. The differently aligned second protons 53 lead therefore to different nuclear resonance signal than the first protons 51 since the second protons 53 are aligned in a different manner and depending on the submarine's 13' configurations, can even exhibit a net cancellation effect.

This leads to a "magnetic hole" symbolized by 54 in FIG. 8 the volume of which can be considerably more than the volume of the "proton hole".

If a submarine 13' made from material which generates a magnetic hole 54 travels completely through the volume region 50 or is included within it, that leads naturally to a substantially stronger measured effect S than that described above in connection with the proton hole 52 since now the quotient of the corresponding volumes also changes accordingly.

FIG. 9 illustrates a further embodiment of the invention in which a transmission coil $15b$ is not configured as a surface coil at the surface of the ocean 11 but rather is suspended in a floating state at a given distance from the ocean floor 60 or is towed at a given distance along the ocean floor 60.

In this way e.g. sea mines 61 which are buried or washed into the mud 62 of the ocean floor can be localized. Mud 62 consists, namely, also of water i.e. a substance containing a high quantity of protons so that the sea mine 61 also leads to a proton hole or even to a magnetic hole as was illustrated in FIG. 8 above.

FIG. 10 shows some further embodiments of the invention.

Initially represented in the upper lefthand portion of FIG. 10 is the usual embodiment previously shown in FIG. 2 and 8, with which a transmission coil 15 is towed by a frigate 10 or another surface vessel. Clearly, however, instead of a frigate 10, an airborne vehicle e.g. a helicopter or a naval aircraft can also be used here to tow the transmission coil 15.

A further embodiment is represented in the upper right-hand portion of FIG. 10 wherein a transmission coil $15c$ is towed at an inclined angle with respect to the vertical for which purpose, appropriate floating anchors can be used which, for the sake of clarity, are not shown in FIG. 10. This leads to an enlargement of the volume region $50c$ as FIG. 10 clearly shows, since a nuclear resonance is now excited in the sea water on both sides of the transmission coil $15c$. Here the tilt angle can be adjusted, depending on the inclination of the earth's magnetic field $B_0$, in such a way that the field lines of the electromagnetic alternating field run as perpendicularly as possible to the direction of the earth's magnetic field $B_0$. In this case it is particularly useful to align the coil plane with the course of the frigate since then the volume range on both sides of the course is covered.

In the bottom lefthand portion of FIG. 10, two further variations are illustrated using a magnet 65 incorporating ferromagnetic material. Towards this end, in the right half of the embodiment represented in the bottom lefthand portion, a magnet core 66 is wound with a transmission coil 15d and the entire configuration is buried in the ocean floor 60.

Finally, FIG. 10 shows a further variation in the bottom righthand portion in which, across a strait 68 or on both sides of it, resonance configurations 15e and 15e' have been arranged the dimensions of which amount to multiples of the quarter wavelength of the alternating electromagnetic field. As indicated by field lines 21e, in this way a resonance field is formed in the resonance arrangements 15 e and 15e' which can exhibit different modes of oscillation i.e. different spatial distributions of the field lines. As resonance arrangements, radiating doublets or parallel axis configurations of straight conductors are possible through which phase shifted currents pass and which exhibit a length which is multiples of a quarter wavelength.

In the embodiments described above it is generally understood that the nuclear magnetic resonance is excited utilizing the earth's magnetic field $B_0$ as a constant field. However, it is understood that in addition to the earth's magnetic field $B_0$, externally generated static magnetic fields can also be used including all kinds of coil configurations such as those explained in connection with the transmission coils 15 to 15e in the FIGS. 1 through 10. In particular, a strengthening of such a static measuring field using a magnet core 66 or its generation using a permanent magnet can, in this respect, be taken into consideration. With such an externally generated static magnet field the relatively small 0,5 Gauss measuring field strength of the earth's magnetic field $B_0$ can be increased by one or several orders of magnitude so that, by correspondingly adjusting the measuring frequency, an increase in the intensity of the signal is also achieved, which, in nuclear resonance experiments, is approximately proportional to the measuring frequency.

Since in an electromagnetic alternating field as well as in a constant field the intensity of the magnetic field strength depends, when a coil is used, on the number of ampere turns, in an embodiment of the invention a superconducting wire coil is used as a magnetic coil. It is known in the art that such superconducting coils allow very high ampere turns to be achieved without having to provide the electrical power necessary in normally conducting air coil configurations. In applications of the kind which are of interest here, the use of modern high temperature superconductors based on ceramics is particularly preferred, such as those which are already known in the art today at temperatures on the order of liquid nitrogen and above.

Furthermore, in all embodiments described above a localization of the objects is performed to the extent that only the presence or absence of such an object, in particular, of a submarine 13, in volume region 50, is determined.

Some further embodiments to allow additional determination of an exact position of the submarine 13 with respect to surface coordinates N, S, W, O and the navigable depth T are described below.

In a first group of embodiments, the procedure of pulsed nuclear resonance is used.

For illustrative purposes, FIG. 11 shows a representation similar to FIG. 3. While in the equilibrium position of FIG. 3 when the magnetization vector M of a proton is uniformly precessing around the Z coordinate axis, i.e. the direction of the active constant field, the proton is then excited by a high frequency pulse, i.e. a gated CW signal at the proton resonance frequency with adjustable duration and adjustable amplitude. The tip of a magnetization vector M which is exposed to such a high frequency pulse while in the equilibrium position of FIG. 3 spatially describes a curved helical path 70 as represented in FIG. 11. Depending on the chosen amplitude and duration of the high frequency pulse, the magnetization vector M will be deflected from the z direction e.g. by 90 degrees into the x, y plane or even by 180 degrees into the z direction. In the first case this is said to be a so-called 90 degree pulse, in the second case a so-called 180 degree pulse.

FIG. 12 shows in the so-called "rotating system $x'/y'$" an experiment in which a 90 degree pulse is initially imposed on a substance whose spins are characterized by a common magnetization vector M in the z direction. The magnetization vector M is hereby deflected from the z direction by 90 degrees e.g. into the $x'$ direction as indicated in FIG. 12 with M'. Due to field inhomogeneities, the magnetization vectors fan out from the $x'$ direction on both sides as indicated in FIG. 13 with M''. If at this moment a 180 degree pulse is imposed on the spin system, all fanned-out magnetization vectors M'' move in the opposite direction in the $x'/y'$ plane and converge approximately at the same time in the direction of the $x'$ axis. This so-called rephasing manifests itself in a measurable echo effect. Further details on the so-called spin-echo technique can be read e.g. in: Laukien, Kernmagnetische Hochfrequenz-Spektroskopie, in: Flügge, Handbuch der Physik, Bd. XXXVIII/1, Springer 1958, S. 120–376.

Towards this end, a pulse sequence is plotted in FIG. 15, in which 73 labels the 90 degree pulse of FIG. 12. Due to the folding over of the magnetization vector M, an induction signal 74 is produced which, however, decays quickly due to the field inhomogeneity. 75 alludes to a subsequent 180 degree pulse according to FIG. 13 and 14 which leads in the manner described above to a spin-echo 76. The 180 degree pulses can be repeated at 77 and even later as a result of which further spin-echos 78 etc. appear.

One can take advantage of this pulse technique in the present context when one considers that the pulse sequence represented in FIG. 15 effects only a rephasing of the magnetization vectors when pulse amplitude and length basically effect a deflection of the magnetization vectors M by 90 or 180 degrees.

In the volume region 50, the length of the pulses 73, 75 and 77 does not change. However, the amplitude of these pulses varies as already explained above in FIG. 2 as a result of the spatially decreasing intensity of $H_1$.

In FIG. 16 a configuration in accordance with the invention is represented in which two transmission coils $15f_1$ and $15f_2$ are arranged side by side on the surface of the ocean. 20f labels the coil axis of the transmission coil $15f_1$ and 21f labels an associated field line. In FIG. 16, 80/1 through 84/1 label only lines (or planes in volume representation) of equal alternating electromagnetic field strength generated by the transmission coil $15f_1$. It shall be assumed now that on the line 83/1 there is a field strength by which a 180 degree pulse is exerted on those protons along the line 83/1. If now a searched-for proton-poor object is at a point 86, this is recognized since the nuclear resonance signal selectively generated by 180 degree pulses on line 83/1 is smaller than a nuclear resonance signal generated on another line 82/1 or 84/1 taking into account the nuclear resonance signal produced at local field strength $H_1$ which is not weakened by a proton-hole as at point 86. In the second transmission coil $15f_2$, however, no weakening of the nuclear resonance signal is registered on the respective line 83/2 since the proton-hole at point 86 is not on line 83/2. If, however, the current in the second coil $15f_2$ is varied so that the 180 degree condition is now fulfilled on the line 82/2, there appears a signal dip since the proton-hole at point 86 now becomes active.

Since the spatial variation of the intensity of the magnetic field strength of the alternating electromagnetic field generated by coils $15f_1$ and $15f_2$ is known, the point 86 can be determined as the point of intersection of lines 83/1 and 82/2 through measurements in which the excitation current in coils $15f_1$ and $15f_2$ is varied.

In such a way, a localization in at least two dimensions of a proton-poor object e.g. a submarine 13 can be performed.

FIG. 17 shows in an exemplary representation that the variation of the excitation current of the coils $15f_1$ and $15f_2$ according to FIG. 16 can be converted into a two-dimensional grid of coordinates 89 in which, on the abscissa, a coordinate direction is applied which coincides with the course s and, on the ordinate, the depth T. Now, if coils $15f_1$ and $15f_2$ are stationary during the measurement, each segment 90 of the grid of coordinates 89 can be inspected by cyclically switching the excitation currents of the alternating electromagnetic field by stepwise increasing and decreasing them. In this manner, for the case of larger three-dimensional objects, several segments 90 are recognized as proton-poor so that by appropriate imaging, a two-dimensional silhouette 91 of the submarine 13 can be represented. The depth T and the position along course s can be extracted from the silhouette 91.

If now, in addition to the coils $15f_1$ and $15f_2$ of FIG. 16, a third coil is added perpendicularly to the drawing plane, a three-dimensional resolution can also be achieved. This leads to the three-dimensional grid of coordinates 92 represented in FIG. 18 whose three-dimensional segments 93 can also be inspected cyclically by stepwise change of the excitation currents in order to determine those three-dimensional segments 93 in which the proton resonance signal is weakened or even disappears. With the aid of appropriate imaging, a three-dimensional region 94 can be identified which corresponds to the position of the submarine 13.

In this manner, a region 96 for depositing water bombs or the like can be determined said region being found on the basis of the position coordinates 97 and 98 of the region 94. Also the depth 99 of the region 94 can be extracted in a simple fashion.

The method described above by means of FIG. 16 to selectively measure two-dimensional segments 90 or three-dimensional segments 93 of a two- or three-dimensional grid of coordinates 89 or 92 is only one of several examples.

Additionally, in this way, other numerous additional imaging and/or volume selective methods and apparatuses can be instituted as they are known in the art of nuclear spin tomography and as they are described e.g. at Roth, NMR-Tomographie und Spektroskopie in der Medizin, Springer 1984.

In these methods, one or many so-called gradient fields are superimposed on a constant field. They are static magnetic fields whose intensity varies spatially in a predetermined manner. If now several gradient fields of this kind are sequentially superimposed on the constant field, a magnetic encoding of the volume region can be performed in that, at a given moment, a given intensity value of the constant field is assigned to each point in the volume region. Thereby, a certain resonance frequency is also assigned to each of these points since the gyromagnetic ratio is a constant. By varying the frequency of the alternating electromagnetic field, the various points in the volume region can be sequentially inspected and selectively examined for the presence of protons. The variation of frequency can be achieved either by adiabatically sweeping the frequency of the alternating electromagnetic field i.e. effecting a so-called "frequency sweep"or, as is also possible by means known in the art of nuclear spin tomography, by performing a broad-band excitation of the volume region with a multitude of frequencies and by analyzing and imaging the response of the spin system in the volume region with the aid of Fourier Transformation. The methods and apparatuses required to do so are known in the art of nuclear spin tomography and shall therefore, for the sake of clarity, not be repeated in further detail here.

FIG. 17 shows an arrangement in which a gradient coil 105 with associated power supply 106 is buried in the ocean floor. The gradient coil 105 generates a static magnetic field B around its coil axis 107, whose intensity depends not only on the number of Ampere turns of the coil 106, but also on the spatial coordinates since due to the dimensions of the gradient coil 105 which are of interest here, of several meters to in excess of kilometers in diameter, no homogeneous field distribution can be achieved. Therefore, in the vicinity of a transmission coil 15 g, which generates an alternating electromagnetic field $H_1$, a superposition of the earth's magnetic field $B_0$, of the static gradient field B, and of the alternating electromagnetic field $H_1$ occurs. This leads to different measuring conditions at virtually each point of the volume region covered by the transmission coil 15 g so that, by varying the parameters, segments in the volume region can be sequentially investigated. This variation can be performed by e.g. varying the strength of the electric current I in the gradient coil 105, by varying the strength of the electric current i in the transmission coil 15 g, by varying the inclination of the transmission coil 15g or by transporting the transmission coil 15g by means of frigate 10. Also combined time-varying changes in these parameters are possible and lead, to the extent that they are reproducible, to a defined encoding of all segments in the volume region of interest.

At this point it is again emphasized that all "coils" in the context of the present invention are to be considered mutually equivalent with regard to form, dimensions and position so that the representations given in the other figures e.g. FIG. 9 and 10 are equally valid for transmission coils, receiving coils, coils for the production of an additional static field, or gradient coils.

FIG. 20 shows a combined arrangement in which a transmission coil 15h in the form of a surface coil with vertical axis 2h is provided for. The transmission coil 15h is supplied by an excitation current i from a variable transmitter 35h. A detection coil 15h' is arranged with a vertical coil plane so that its coil axis 20h' is perpendicular to axis 20 h of the transmission coil 15h. The signal of the detection coil 15h' is input to an amplifier 37 h. A coil 105 h generates either a static measuring field or a gradient field in which the axis 107 h of the coil 105 h is arranged perpendicularly to the axes 20 h of the transmission coil 15h and 20h' of the detection coil 15h'. Therefore, the coil plane of the coil 105 also extends in a vertical direction. The coil 105 h is fed by an excitation current I from a variable power supply 106 h.

A common steering apparatus 110 is connected to the variable transmitter 35h, the receiver 37 h, as well as to the variable power supply 106 h. The steering apparatus 110 generates one of the above described procedures of continuous or gated adjustment of the transmitter 35 h as well as of appropriate adjustment of the excitation current I in the coil 105 h in order to examine selected segments within a grid of coordinates in the volume region 50 h covered by the coils 15 h, 15 h' and 105 h for the presence of protons, as was shown further above by means of FIG. 18.

Finally, FIG. 21 shows in perspective representation a so-called coil array 15$i_1$, 15$i_2$, 15$i_3$ of rectangular coils which are supplied with separate excitation currents i1, i2 and i3 in order to achieve spatial resolution in accordance with explanations associated with FIG. 16, by varying the alternating electromagnetic field. Correspondingly, however, the configuration of FIG. 21 can be used for gradient coils in order to impose an appropriate profile of several gradients of static magnetic fields on the volume region.

It is understood that the embodiments described above are not at all to be considered restrictive but rather that numerous variations are possible without exceeding the framework of the present invention.

For example, instead of the coil shapes described, long wire arrangements, dipole arrangement and the like can also be provided for in order to generate the static magnetic fields or the alternating electromagnetic fields. In addition, the dimensions and frequency ranges named are by no means to be considered restrictive since, e.g. in the event of transition to other nuclei e.g. carbon or fluorine isotopes, other gyromagnetic ratios and therefore, for constant field strengths, other frequencies must be generated.

SUMMARY

A method and an apparatus serve to locate proton-poor objects situated in aqueous surroundings, in particular to locate submarines (13) or sea mines in an ocean (11) or an inland water. Thereby, making use of nuclear magnetic proton resonance, a magnetic disturbance caused by the object in relation to its surroundings is detected. Towards this end, the apparatus exhibits at least one transmission coil (15) to excite the nuclear resonance by means of an alternating electromagnetic field as well as detection means to detect a resonance signal.

In order to also be able to locate non-ferromagnetic objects with high spatial precision, conditions are generated for the occurrence of a water proton nuclear magnetic resonance in a volume region of more than 50 cubic meters, preferably considerably more than 1000 cubic meters of water. The volume region is monitored for the presence of resonance signals and decreases in the resonance signals are detected (FIG. 1).

I claim:

1. A method for localizing proton-poor objects situated in aqueous surroundings, particularly for localizing submarines or sea mines in an ocean or an inland water, wherein a magnetic disturbance being caused by said object in relation to said surroundings is detected through using nuclear magnetic proton resonance techniques, the method comprising the steps of:

establishing conditions for an occurrence of a nuclear magnetic resonance of water protons in a volume region of said aqueous surroundings;

monitoring said volume region for an occurrence of resonance signals; and detecting a decrease in said resonance signals.

2. The method of claim 1, wherein said establishing step comprises the step of generating said nuclear magnetic resonance in the earth's magnetic field by irradiating said protons with an alternating electromagnetic field having a frequency corresponding to said strength of said earth's magnetic field, multiplied by the gyromagnetic ratio of said protons.

3. The method of claim 2, wherein said establishing step further comprises the step of superimposing on said earth's magnetic field a static auxiliary field, thereby generating a resulting total field, said frequency of said alternating electromagnetic field corresponding to the strength of said resulting total field multiplied by said gyromagnetic ratio of said protons.

4. The method of claim 1, wherein said alternating electromagnetic field is generated by a continuous-wave (CW) signal.

5. The method of claim 1, wherein said alternating electromagnetic field is generated by a gated continuous-wave (CW) signal.

6. The method of claim 5, wherein spin-echos of said protons are generated by means of said gated CW signal.

7. The method of claim 1, wherein said monitoring step comprises the step of monitoring said volume region by means of nuclear spin tomographical imaging methods in approximately point-shaped segments of a multi-dimensional grid of coordinates.

8. The method of claim 7, wherein said nuclear magnetic resonance in said segments is generated by superimposing upon said earth's magnetic field an auxiliary gradient field of predetermined spatial field strength variation.

9. The method of claim 7, wherein said alternating electromagnetic field is generated by a gated continuous-wave (CW) signal, said nuclear magnetic resonance in said segments being generated by adjusting a high-frequency electromagnetic field strength of said gated CW signal having a predetermined spatial field strength variation.

10. An apparatus for localizing proton-poor objects submerged in water, in particular for localizing submarines or sea mines, comprising:

a transmission coil for exciting a nuclear magnetic proton resonance by means of an alternating electromagnetic field within a volume region of said water of more than 50 cubic meters, preferably considerably more than 1000 cubic meters; and receiving means for detecting a nuclear magnetic resonance signal, said receiving means including a unit for detecting a predetermined decrease in said nuclear magnetic resonance signal.

11. The apparatus of claim 10, wherein said transmission coil is arranged in an ocean or an inland water and is connected with a sea-borne vehicle equipped with transmission and detection means.

12. The apparatus of claim 11, wherein said sea-borne vehicle is a ship, in particular a frigate, being bound to a surface of said water.

13. The apparatus of claim 10, wherein said transmission coil is arranged in or above an ocean or an inland water an is connected with an air-borne vehicle equipped with transmission and detection means.

14. The apparatus of claim 11, wherein means are provided for towing said transmission coil in a direction parallel to a surface of said ocean or said inland water along a predetermined course.

15. The apparatus of claim 11, wherein means are provided for towing said transmission coil in a direction parallel to a bottom of said ocean or said inland water along a predetermined course.

16. The apparatus of claim 6, wherein said transmission coil is arranged stationarily in an ocean or an inland water and is connected with stationary transmission and detection means.

17. The apparatus of claim 16, wherein said transmission coil is configured as a resonance circuit having dimensions corresponding to multiples of a quarter wavelength of said alternating electromagnetic field.

18. The apparatus of claim 10, wherein said transmission coil is configured as individual coils being arranged on both sides of a strait.

19. The apparatus of claim 10, wherein said transmission coil is buried in an ocean floor.

20. The apparatus of claim 10, wherein said transmission coil is floating in an ocean.

21. The apparatus of claim 10, wherein said transmission coil is connected to said receiving means for acting as a combined transmitter and detector.

22. The apparatus of claim 10, wherein said detection means comprise a detection coil and a transmission coil, separated from each other.

23. The apparatus of claim 12, wherein said detection coil is in close proximity to said transmission coil and has a coil plane extending essentially perpendicularly to a coil plane of said transmission coil.

24. The apparatus of claim 10, wherein said transmission coil is arranged at an angle other than 0 degrees with respect to the direction of said earth's magnetic field.

25. The apparatus of claim 10, wherein field means are provided for generating a constant magnetic field within said volume region.

26. The apparatus of claim 25, wherein said field means are designed as gradient means, generating in said volume region a constant field having a predetermined spatial field strength variation.

27. The apparatus of claim 25, wherein said field means are designed as field coils.

28. The apparatus of claim 27, wherein said field coil is arranged with its coil plane essentially perpendicularly to a coil plane of said transmission coil.

29. The apparatus of claim 25, wherein said field means are designed as a permanent magnet.

30. The apparatus of claim 10, wherein said transmission coil is formed from ring coils.

31. The apparatus of claim 10, wherein said transmission coil is formed from coils having polygon-shaped coil planes.

32. The apparatus of claim 10, wherein said transmission coil is formed from a group of individual coils.

33. The apparatus of claim 10, wherein said transmission coil is provided with a ferromagnetic core.

34. The apparatus of claim 10, wherein said transmission coil is wound from a superconducting wire.

35. The apparatus of claim 34, wherein said superconducting wire is made from a high-temperature superconductor.

36. The apparatus of claim 10, wherein said transmission coil has a coil area of more than 10 square meters, preferably considerably more than 100 square meters.

37. The apparatus of claim 32, wherein said coils have different coil areas.

38. The apparatus of claim 10, wherein said detection means include scanning means for allowing a localized detection of said nuclear magnetic resonance signal.

39. The apparatus of claim 38, wherein said scanning means cooperate with transmission coil towing means, said scanning means recording a detection of a predetermined decrease in said nuclear magnetic resonance signal as a function of a geographic position of said transmission coil.

40. The apparatus of claim 38, wherein said scanning means include nuclear spin tomographical imaging means individually recording detection of a predetermined decrease in said nuclear magnetic resonance signal for approximately point-shaped segments of a multi-dimensional grid of coordinates.

41. The apparatus of claim 40, wherein said imaging means comprise a pulse generator for controlling a transmitter feeding said transmission coil, said transmitter emitting a gated continuous-wave (CW) signal and having means for adjusting an amplitude and a duty cycle of said gated CW signal.

42. The apparatus of claim 40, wherein said imaging means comprise a power supply for adjusting predetermined gradients of a constant magnetic field generated in said volume region.

43. The apparatus of claim 40, wherein said imaging means comprise a sweeping unit controlling a transmitter feeding said transmission coil.

44. The apparatus of claim 43, wherein said transmission coil is designed as a resonance system and said sweeping unit is designed for stepwise varying a frequency of said transmitter for generating different resonance modes in said resonance system.

45. The apparatus of claim 40, wherein said imaging means includes means for altering a position of said transmission coil for generating an alternating electromagnetic field in said transmission coil having a predetermined spatial field strength variation.

46. The apparatus of claim 40, wherein said imaging means comprises means for altering a position of said field means for generating a constant magnetic field in said field means having a predetermined spatial field strength variation.

47. The apparatus of claim 40, wherein said imaging means comprises a multitude of transmission coils or of detection coils being designed to be selectively controllable.

48. The apparatus of claim 10, wherein said unit for detecting a predetermined decrease in said nuclear magnetic resonance signal comprises an alarm indicator being activated if, in said volume region, said decrease corresponds to that of a proton-poor volume being approximately equal to the volume of a submarine under detection.

49. The apparatus of claim 10, wherein said unit for detecting said predetermined decrease in said nuclear magnetic resonance signal comprises an alarm indicator being activated if, in the volume region, said decrease corresponds to that of a proton-poor volume being approximately equal to the volume of a sea mine.

50. The apparatus of claim 10, wherein said alternating electromagnetic field has a frequency of 1 to 3 kHz.

* * * * *